Figure 1:
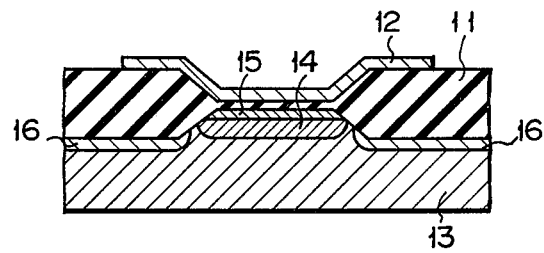

United States Patent [19]

Masuoka

[11] 4,426,687
[45] Jan. 17, 1984

[54] SEMICONDUCTOR MEMORY DEVICE

[75] Inventor: Fujio Masuoka, Yokohama, Japan

[73] Assignees: Tokyo Shibaura Denki Kabushiki Kaisha, Japan

[21] Appl. No.: 224,012

[22] Filed: Jan. 12, 1981

[30] Foreign Application Priority Data

Jan. 25, 1980 [JP] Japan ................................. 55-7525

[51] Int. Cl.³ ........................ G11C 11/40; G11C 7/00
[52] U.S. Cl. .................................... 365/182; 365/205
[58] Field of Search ............... 365/205, 207, 208, 210, 365/104, 182, 184

[56] References Cited

U.S. PATENT DOCUMENTS

| 3,959,781 | 5/1976 | Mehta et al. | 365/210 |
| 4,192,014 | 3/1980 | Craycraft | 365/104 |
| 4,270,189 | 5/1981 | Brossard et al. | 365/205 |
| 4,270,190 | 5/1981 | Jindra et al. | 365/205 |
| 4,291,391 | 9/1981 | Chatterjee et al. | 365/184 |

OTHER PUBLICATIONS

Krick "Self-Differential Sensing of MNOSMemory Arrays", vol. 16, No. 12, 5/74, pp. 4098-4099, IBM Tech. Disc. Bul.
Krick, "Dual-Level Sense Scheme for Composite Insulator Memory Arrays", IBM Tech. Disc. Bul., vol. 17, No. 6, 11/74, pp. 1811-1813.
Chatterjee et al ., Circuit Optimization of the Taper Isolated Dynamic Gain RAM Cell for VLSI Memories, IEEE International Solid-State Circuits Conference 22-27, (Feb. 14, 1979).

Primary Examiner—Stuart N. Hecker
Attorney, Agent, or Firm—Finnegan, Henderson, Farabow, Garrett & Dunner

[57] ABSTRACT

At least one taper isolated dynamic RAM cell and at least one dummy cell are provided. Between the RAM cell and the dummy cell a flip-flop sensing amplifier is connected. The dummy cell has a conductance which is half the sum of the conductance $G_1$ of the RAM cell which corresponds to binary digit "1" and the conductance $G_0$ of the RAM cell which corresponds to binary digit "0". Using the conductance of the dummy cell as a reference, the flip-flop sensing amplifier detects and read data from the RAM cell.

6 Claims, 2 Drawing Figures

SEMICONDUCTOR MEMORY DEVICE

This invention relates to a semiconductor memory device, and more particularly a one-transistor dynamic semiconductor memory device.

Recently there was invented a taper or tapered isolated dynamic gain RAM cell which now attracts much attention. The RAM cell comprises a field effect transistor but does not includes a capacitor. The conductance of the transistor varies, depending on whether or not charge exists between the source and drain of the transistor. The conductance of the transistor is detected, and thus a binary digit "1" or "0" is read out from the taper isolated dynamic gain RAM cell. Not including a capacitor, the RAM cells may provide a memory cell matrix of a high packing density. For this reason the taper isolated dynamic gain RAM cells are highly evaluated indeed, but they are not used in practice. Neither a sensing amplifier nor a data writing circuit has been invented which may used to read binary digits from, or write binary digits into, the taper isolated dynamic gain RAM cells.

It is an object of this invention to provide a semiconductor memory device provided with means which can easily read binary digits from taper isolated dynamic gain RAM cells.

A semiconductor memory device according to this invention includes at least one field effect transistor whose conductance varies depending on presence and absence of charge between the source and drain and at least one flip-flop which detects the conductance of the transistor thereby to read a binary data according to the conductance thus detected.

Figure 2:
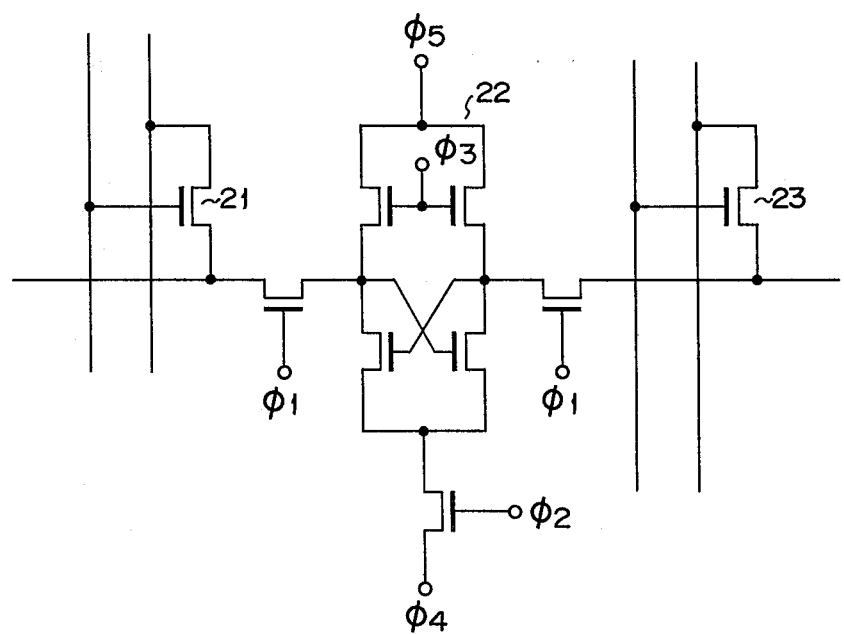

This invention can be more fully understood from the following detailed description when taken in conjunction with the accompanying drawing, in which:

FIG. 1 is a cross sectional view of a junction type field effect transistor used in a semiconductor memory device according to this invention; and FIG. 2 is a circuit diagram illustrating a part of a semiconductor memory device according to this invention.

FIG. 1 is a cross sectional view of a field effect transistor, or a taper isolated dynamic gain RAM cell. The transistor comprises an insulating film 11, a polysilicon gate electrode 12 laid on the film 11 and a silicon substrate 13. As shown in FIG. 1, the insulating film 11 is tapered to have a thin portion in the channel region of the transistor. In that portion of the substrate 13, which is right below the polysilicon gate electrode 12, there are formed a thick N-type region 14 and a thin P-type region 15. Further, a P+-type region 16 is formed also in the substrate 13 so as to surround the channel region of the transistor.

When charge is accumulated in the channel region below the electrode 12, the transistor has its conductance reduced. When the charge is reduced nearly to zero, the transistor comes to have a considerably large conductance. Let the conductance be assumed to have value "1" when substantially no charge is accumulated in the channel region. Then, the conductance will be reduced to 0.1 or less when charge is accumulated in the channel region. By detecting such changes of conductance, binary digits "1" and "0" can be read from the transistor. To detect changes of the conductance of the transistor, use is made of such a circuit as shown in FIG. 2.

The circuit shown in FIG. 2 includes a sensing amplifier 22 which detects how the conductance of a selected memory cell 21 does change, using the conductance of a dummy cell 23 as a reference. The dummy cell 23 is of the same structure as the memory cell 21, except that the ratio of channel width to channel length is approximately half that of the memory cell 21. More precisely, the following formula is established, wherein $L_C$ and $W_C$ denote the channel length and width of the memory cell 21 and $L_D$ and $W_D$ denote the channel length and width of the dummy cell 23:

$$(W_C/L_C) \approx 2(W_D/L_D) \tag{1}$$

Formula (1) means that the ratio of the conductance of the cell 21 to that of the cell 23 is approximately 2. Thus, if the conductance of the cell 21 is "1" when no charge is accumulated in the memory cell 21, the conductance of the dummy cell 23 is "0.5" when no charge is accumulated in the dummy cell 23. In this case, the sensing amplifier 22 detects, for example, a binary digit "1" when the conductance of the dummy cell 23, i.e. reference conductance, is 0.5 or more and detects, for example, a binary digit "0" when the reference conductance is less than 0.5.

Sensing amplifier 22 uses a ratioless type flip-flop sensing amplifier which is therefore highly sensitive and consumes little power. What is more, it can achieve a high speed detection.

As mentioned above, the ratio of channel width to channel length in the dummy cell 23 is half the ratio in the memory cell 21. More appropriately, it is sufficient if the conductance $G_D$ of the dummy cell 23 is expressed by the following equation wherein $G_1$ denotes the conductance of the memory cell 21 when it stores binary digit "1" and $G_0$ denotes the conductance of the memory cell 21 when it stores binary digit "0":

$$G_D = (G_1 + G_0)/2 \tag{2}$$

Therefore, conductance $G_D$ will be 0.75 when conductances $G_1$ and $G_0$ are 1.0 and 0.5, respectively. As a result, the ratio of the conductance of the memory cell 21 to that of the dummy cell 23 turns out to be 1:0.75. Accordingly the ratio of channel width to channel length in the memory cell 21 is 0.75. Thus, every memory cell amplifier that amplifies an input signal according to equation (1) may be used as a sensing amplifier to read binary data from a dynamic RAM cell whose conductance varies depending on presence and absence of charge.

As mentioned above, this invention uses at least one field effect transistor as a memory cell, whose conductance varies depending on presence and absence of charge between the source and drain; at least one field effect transistor as a dummy cell, which has the same structure as the memory cell and whose conductance is half the sum of the conductance of the memory cell storing binary digit "1" and the conductance of the memory cell storing binary digit "0". Use is made of a balanced flip-flop sensing amplifier for detecting the conductance of the memory cell using the conductance of the dummy cell as a reference. The balanced flip-flop sensing amplifier is sensitive to the data stored in the memory cell. This helps make the memory cell small. Further, since the conductance of the dummy cell formed on a semiconductor chip is about half that of the memory cell and can thus be used as a reference conductance for detecting the conductance of the memory cell by means of the sensing amplifier, a memory chip of a high cost-performance is obtained. Still further, data can be written into the dummy cell merely by discharging the dummy cell, i.e. by bringing the dummy cell into a thermal equilibrium when data are read from the memory cell or when the memory cell is refreshed. For this reason, a writing circuit for the dummy cell can be simplified.

What is claimed is:

1. A tapered isolated gain semiconductor device comprising:

a first field effect transistor capable of being in one of two binary states, said transistor having a source, a drain, a channel which is formed on a substrate, an insulating film tapered to have a thin portion on said channel, and a gate electrode laid on said insulating film, the conductance of said first field effect transistor indicating the binary state of said first field effect transistor and varying according to the presence and absence of charge between said source and said drain; and a field effect transistor circuit for detecting the conductance of said first field effect transistor to determine which one of said binary states said first field effect transistor is in, said circuit including a second field effect transistor having a conductance $G_D$ equal to one half the sum of $G_1$, the conductance of said first field effect transistor when it is in a first binary state, and $G_0$, the conductance of said first field effect transistor when it is in a second binary state, said second field effect transistor also having a channel width to channel length ratio approximately equal to $(G_1+G_0)/(2 \times G_1)$ the channel width to channel length ratio of said first field effect transistor and means for comparing the conductances of said first and said second transistors to determine the binary state of said first transistor.

2. A semiconductor device according to claim 1, wherein said comparing means includes a flip-flop sensing amplifier.

3. A semiconductor device according to claim 1, wherein said first field effect transistor has a first channel length and a first channel width and said second field effect transistor has a second channel length which is half the first channel length and a second channel width which is half the first channel width.

4. A semiconductor device according to claim 3, wherein said second field effect transistor has the same structure as said first field effect transistor.

5. A sense amplifier for tapered isolated dynamic gain RAM cells which each include a first field effect transistor capable of being in one of two binary states determined by different conductance values of said first field effect transistor, said sense amplifier comprising:

a sense field effect transistor having a conductance $G_D$ equal to one half the sum of $G_1$ and $G_0$ the conductance values of said first cell field effect transistor when it is in a first binary state and when it is in a second binary state respectively, said sense filed effect transistor also having a channel width to channel length ratio approximately equal to $(G_1+G_0)/(2 \times G_1)$ of the channel width to channel length ratio of said first filed effect transistor; and means for comparing the conductances of said field effect transistor and said sense field effect transistor to determine the binary state of said first cell field effect transistor.

6. The sense amplifier in claim 5 wherein said comparing means includes a flip-flop sensing amplifier.

* * * * *